(12) United States Patent
Wimberger Friedl et al.

(10) Patent No.: US 6,665,192 B2
(45) Date of Patent: *Dec. 16, 2003

(54) SYNTHETIC RESIN CAPPING LAYER ON A PRINTED CIRCUIT

(75) Inventors: Reinhold Wimberger Friedl, Eindhoven (NL); Egbert Broeksema, Eindhoven (NL); Henricus A.C. Deeben, Neerpelt (BE)

(73) Assignee: Koninklijke Philips Electronics N.V., Eindhoven (NL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/024,637

(22) Filed: Feb. 17, 1998

(65) Prior Publication Data

US 2002/0029900 A1 Mar. 14, 2002

(30) Foreign Application Priority Data

Feb. 18, 1997 (EP) ................................ 97200470

(51) Int. Cl.⁷ ............................ H05K 5/00; H05K 5/04; H05K 5/06
(52) U.S. Cl. ........................ 361/752; 361/737; 174/52.2
(58) Field of Search ................................ 361/736–737, 361/752–753, 760, 712–719, 748, 800, 816, 818; 174/52.2, 35 R; 257/788–792; 428/217–218

(56) References Cited

U.S. PATENT DOCUMENTS

| | | | | | |
|---|---|---|---|---|---|
| 3,564,164 | A | * | 2/1971 | Prescott | 179/103 |
| 4,190,697 | A | * | 2/1980 | Ahrens | 428/309.9 |
| 4,822,550 | A | | 4/1989 | Komathu | 264/263 |
| 4,992,481 | A | * | 2/1991 | von Bonin et al. | 521/54 |
| 5,218,759 | A | | 6/1993 | Juskey et al. | 29/840 |
| 5,335,076 | A | * | 8/1994 | Reh et al. | 348/794 |
| 5,379,186 | A | * | 1/1995 | Gold et al. | 361/706 |
| 5,392,197 | A | * | 2/1995 | Cuntz et al. | 361/818 |
| 5,394,304 | A | * | 2/1995 | Jones | 361/765 |
| 5,406,027 | A | * | 4/1995 | Matsumoto et al. | 174/52.2 |
| 5,432,676 | A | | 7/1995 | Satoh et al. | 361/752 |
| 5,541,813 | A | | 7/1996 | Satoh et al. | 361/752 |
| 5,703,761 | A | * | 12/1997 | Heiss | 361/800 |
| 5,845,929 | A | * | 12/1998 | Schlett et al. | 280/728.3 |
| 5,872,332 | A | * | 2/1999 | Verma | 174/35 C |
| 5,995,374 | A | * | 11/1999 | Suzuki et al. | 361/767 |
| 6,061,236 | A | * | 5/2000 | Klein | 361/695 |
| 6,184,464 | B1 | * | 2/2001 | Liptak et al. | 174/52.4 |

FOREIGN PATENT DOCUMENTS

| | | |
|---|---|---|
| EP | 0650315 A2 | 4/1995 |
| JP | 9252184 | 9/1997 |

* cited by examiner

*Primary Examiner*—Kamand Cuneo
*Assistant Examiner*—Tuan Dinh
(74) *Attorney, Agent, or Firm*—Steven R. Biren

(57) ABSTRACT

A printed circuit is provided with a synthetic resin capping layer that exhibits a continuous variation of mechanical properties in a direction at right angles to its surface. The printed circuit can be in a mobile telephone or other portable device, and the capping layer of the printed circuit can optionally constitute the housing of the device.

5 Claims, 1 Drawing Sheet

SYNTHETIC RESIN CAPPING LAYER ON A PRINTED CIRCUIT

BACKGROUND OF THE INVENTION

The invention relates to a method of providing a synthetic resin capping layer on a printed circuit, said printed circuit comprising a printed circuit board which is provided with at least one electric component, and the capping layer exhibiting a variation in mechanical properties in a direction at right angles to said capping layer. The invention also relates to a printed circuit which is provided with a synthetic resin capping layer, said printed circuit comprising a printed circuit board having at least one electric component, and the capping layer exhibiting a variation in mechanical properties in a direction at right angles to said capping layer. The invention further relates to a portable apparatus, in particular a mobile telephone, comprising a printed circuit obtained by means of such a method.

A method of the type mentioned in the opening paragraph is known. For example, in European Patent Application EP-A-0650315, inter alia, a description is given of a method in which a printed circuit is provided with a capping layer composed of a stack of various layers having different mechanical properties. The capping layer comprises a relatively thin innermost insulation layer, which is contiguous to the printed circuit and accurately follows its contours, which insulation layer is provided with a relatively soft supporting layer which, in turn, is covered with an outermost layer which, in comparison with the supporting layer, is relatively hard and stiff, so that the stack of layers provides for a satisfactory mechanical protection of the printed circuit. To enhance the recyclability, the layers are made from the same kind of synthetic resin, for example a polyurethane. Differences in mechanical properties are obtained by varying both the type and the quantities of the starting materials. Both the supporting layer and the outermost layer are obtained by accommodating the printed circuit in a suitable mould, whereafter a two-component polyurethane casting resin is poured into the mould and the whole is cured for some time, for example 15 minutes. This method of providing a capping layer exhibiting a variation in mechanical properties in a direction at right angles to said layer is labor-intensive because each layer requires a separate moulding process. In addition, the process in which a moulding resin is moulded so as to form a layer is characterized by a long residence time in the mould which, from a practical point of view, leads to an unattractive process, in particular if the mould does not form part of the finished product. In addition, said method leads to a capping layer in which the mechanical properties differ discontinuously from layer to layer. Owing to differences between the coefficients of expansion, mechanical stresses and temperature-induced stresses will, in particular, strain the interfaces between the layers. These stresses could be reduced by using a larger number of layers, however, this leads to a proportionally longer duration of the manufacturing process.

SUMMARY OF THE INVENTION

One of the objects of the invention is to obviate these drawbacks. The invention particularly aims at providing a method of applying a synthetic resin capping layer to a printed circuit, said capping layer being applied, by means of a single-layer process, in a short period of time of, typically, less than 5 or better still 1 minute, and said capping layer exhibiting a variation in mechanical properties in a direction at right angles to the capping layer, so that the circuit is properly protected against mechanically and thermally induced stresses. However, the application of this method must not cause damage to the printed circuit.

This object is achieved by a method of the type mentioned in the opening paragraph, which is characterized, in accordance with the invention, in that the capping layer is provided on the printed circuit by injection moulding of a foam-forming reactive injection-moulding material.

Reactive injection moulding (abbr. RIM) proves to be a technique which can very suitably be used to provide printed circuits with a capping layer. The use of a foam-forming reactive injection-moulding material results in a capping layer whose mechanical properties, viewed from the side facing the printed circuit to the side facing away from the circuit, change from the properties belonging to a foam, that is, relatively soft and elastically compressible, to the properties of a solid material, that is, hard and stiff (in torsion). In fact, due to the proximity of the printed circuit, the regions of the capping layer immediately adjacent to the surface facing the printed circuit are somewhat more dense and stiff than the regions of the capping layer which are somewhat further removed from said surface. However, in the context of the present invention this slightly more intricate pattern of variation is relevant. Such a construction of the capping layer provides the parts of the circuit thus covered with an excellent mechanical protection. For example, shocks and vibrations are effectively damped by the soft interior and the hard outer portion prevents damage to the connections between the components and the printed circuit board, for example, by applied torsional forces. The mechanical properties change continuously, which leads to a uniform spread of the mechanical strain. Since the side facing the circuit is elastic and compressible, any expansion or shrinkage caused by changes in temperature during operation of the circuit can be effectively dealt with. As the capping layer will exhibit an improved heat conduction relative to still air, said capping layer stimulates heat dissipation and, as a result, the thermal strain on the circuit is reduced. Another advantage resides in that, if the thickness of the capping layer provided is sufficient, there is a great freedom of design regarding the side of the capping layer facing away from the circuit, so that said capping layer can also be used for constructive or decorative purposes. In a particularly advantageous embodiment, the capping layer also forms the housing of a device which comprises the circuit. In another, equally advantageous embodiment of the method, (a part of) the housing, which is formed, for example, in a preceding process step by means of injection moulding of a thermoplastic material, is used as the injection mould for applying the capping layer.

The provision of the capping layer by means of reactive injection moulding also has the advantage that the process is economically attractive. By virtue of the short residence times in the injection mould, said process is particularly suited for mass production. The inventors have found that the low viscosity and the foam-formation of the reactive injection-moulding material cause the thermal and the mechanical load on the circuit, caused by filling the mould and curing the reactive injection-moulding material, to be very small, so that the circuit is not damaged by the implementation of the method. In the context of the invention, a clear distinction should be drawn between reactive injection moulding and injection moulding of, whether or not elastically compressible, thermoplastic materials. The inventors have found that, in the latter technique, the thermal and mechanical loads are so high during filling the mould that the connections between the components and the printed circuit board can be damaged or even broken, which results in a defective circuit.

Reactive injection moulding is a technique which is known per se. In said technique, a reactive injection-moulding material is injected into an injection mould, whereafter said material reacts, often at an elevated temperature, while curing in the desired shape. As the reactive injection-moulding material is not prepared until just before the injection by intensively mixing, in general, two mutually reactive starting materials in a cavity which is isolated from the mould, highly reactive injection-moulding materials can be used which enable short cycle times to be achieved. The provision of the capping layer on the circuit by means of RIM can be carried out in a customary manner by means of commercially available equipment.

Suitable reactive injection-moulding materials are well known ti those skilled in the art and include, for example, two-component epoxy and polyester resins, however, owing to the low processing temperature, use is preferably made of a polyurethane (PUR) reactive injection-moulding material, which can be prepared by intensively mixing a polyol and an isocyanate, a polyamine and an isocyanate or mixtures thereof. If PUR is used, foaming of the injection-moulding material can be brought about by applying foam-inducing means, such as water. The density of the foam can also be reduced by admixing air during the preparation of the injection-moulding material. The density of the foam can alternatively be reduced by using propellants.

For example, by adding additives, varying the type, quantity and mixing ratio of the mutually reactive starting materials as well as the type and quantity of the foaming agent and the quantity of the injection-moulding material relative to the volume of the mould, capping layers covering a wide range of mechanical and other properties can be prepared. By suitably choosing the exact composition of the reactive injection-moulding material, the properties of the capping layer can be tailored to suit a specific circuit.

The thickness of the capping layer is not critical per se. However, the shape of the injection mould is simpler and hence cheaper if use is made of at least a planarized capping layer, so that the shape of the surface of the capping layer facing away from the circuit is substantially independent of the shape of the surface of the capping layer facing the circuit, with the contours of the latter surface essentially matching the contours of the circuit.

If, apart from the electrical contacts, the circuit must be electrically accessible at other locations, for example for the purpose of testing the circuit, it is advantageous to provide only the regions with the highest mechanical or thermal sensitivity with the capping layer. However, the capping layer can be provided more easily if at least one side of the circuit is at least substantially covered by the capping layer. If such a unilateral capping layer is applied to a printed circuit board on which components are mounted on only one side, the capping layer should preferably be provided on the side on which the components are mounted. As a result, the other side, that is, the side where the soldered joints are situated, remains electrically accessible. However, maximum protection is achieved if the circuit is entirely encapsulated by the capping layer. Therefore, a preferred embodiment of the invention is characterized in that, to envelop the circuit, the capping layer is provided on both sides of the circuit, thereby forming an encapsulation.

The circuit comprises at least one electric, i.e. electric or electronic, component such as a resistor, a coil, a capacitor, a transistor or an integrated circuit.

Another preferred embodiment of the invention is characterized in that, prior to being provided with the capping layer, the circuit is coated with an elastically compressible buffer layer. By virtue thereof, the risk of damage to the circuit as a result of mechanical and thermal stresses which may arise during operation of the circuit, is further reduced.

The buffer layer should be relatively thin relative to the overall height of the circuit. The layer thickness can be chosen such that, for example, only slits which may be situated between the printed circuit board and the components are sealed. It is particularly in slits that, during the injection-moulding process, stresses could develop, which would prevent the formation of foam. The buffer layer can also be provided so as to match the contours of the circuit, in which case the layer thickness can be based on the maximally expected differences between the coefficients of expansion of the buffer layer and the circuit. The buffer layer can be provided by means of methods which are known per se, such as dip coating, curtain coating, powder coating or, in particular, spraying, or by means of other application techniques which hardly, or perhaps not at all, impose mechanical and/or thermal loads on the circuit. It is particularly suitable to use an adhesive foil, which is pressed against the circuit under reduced pressure. The foil may alternatively be pre-formed in a mould in which the contours of the circuit have been reproduced, whereafter the pre-formed foil is provided on the circuit.

Suitable elastically compressible materials for the buffer layer include, for example, non-solid rubbers, (silicone) gels and polyethylenes or, in particular, foamed polyurethanes. A gel which can suitably be used is a mineral oil-swelled styrene ethylene butylene styrene triblock copolymer which can be obtained in the form of foils from the firm of Raychem. Preferably, a deformable viscous material is used, such as a syrup-like or waxlike material. Materials which are particularly suitable are wax-like materials which are solid at room temperature and liquid at the temperature at which the reactive injection moulding of the capping layer takes place, so that, on the one hand, the material can be readily provided and, on the other hand, stresses occurring during the provision of the capping layer are uniformly distributed over the surface of the circuit. Syrup and wax-like materials which are particularly suitable are those which are partly absorbed by the foam being formed during the RIM process, so that a thin gas-filled layer is formed which is contiguous to the circuit and which enables the circuit to expand and shrink freely. Examples of such materials include sodium stearate and a polyethylene oxide having a molecular weight in the range from 4,000 to 10,000.

Another very suitable material is a syrup or wax-like material which is used as a reactant during reactive injection moulding. Said materials enable the variation of the mechanical properties in a direction at right angles to the capping layer to be influenced, so that, for example, the foam formed on the side of the capping layer facing the circuit is lighter and hence less stiff. For example, if a polyurethane capping layer is used, a buffer layer comprising a polyol, such as a polyethylene glycol with terminal hydroxy or amino groups, can be used to influence the variation.

A preferred embodiment is characterized, in accordance with the invention, in that the circuit is also provided with a layer which provides a shield against electromagnetic radiation. Electr(on)ic circuits which, during operation, may be influenced by strong electromagnetic fields are preferably provided with a layer containing sufficient metal to provide an effective shield against electromagnetic radiation (abbr.

EMS). Such a layer may be, for example, a metal foil or a synthetic resin foil reinforced with a metal grid. An EMS layer can be applied to the capping layer by means of techniques which are known per se, such as vapor deposition. It is alternatively possible to use an in-mould decoration technique, by means of which, prior to injecting the reactive injection-moulding material into the mould, an EMS foil is provided in the mould which will subsequently be transferred to the injection-moulded product. If an electrically insulating buffer layer is used, the EMS layer may also be applied so as to be contiguous to the buffer layer, or the capping layer may also serve as the EMS layer by providing said capping layer, for example, with a suitable quantity of electroconductive particles.

The invention also relates to a printed circuit provided with a synthetic resin capping layer, said printed circuit comprising a printed circuit board having at least one electric component, and the capping layer exhibiting a variation of the mechanical properties in a direction at right angles to said capping layer. In accordance with the invention, the printed circuit is characterized in that the variation of the mechanical properties is a continuous variation. The use of a single-layer capping layer has the above-mentioned advantages. A continuous variation, i.e. from the side of the capping layer facing the circuit to the side facing away from the circuit, goes from relatively soft and elastically compressible to stiff and hard, and results in a circuit which comprises such a capping layer and which gives excellent protection against mechanical and thermal loads which may arise during operation.

The invention also relates to a portable apparatus provided with a printed circuit obtained by applying a method in accordance with the invention. A portable apparatus provided with a printed circuit is to be understood to mean, in this context, a piece of equipment of which a substantial part of the volume enclosed in the housing is taken up by the (convex hull of the) circuit, in other words, hand-held equipment such as mobile radios, cordless or mobile telephones, palm top computers, pagers, remote controls, but also in equipment in which the portability is less important, such as in the case of transformers for charging batteries. Particularly in the case of such hand-held apparatus, there is an ongoing need to reduce the size, thickness and/or weight thereof. As, in addition, the economic life of a product generation decreases continually, there is also a need for measures enabling the time necessary to design and develop products to be reduced. Surprisingly, it has been found that these needs are satisfied by employing a printed circuit provided with a synthetic resin capping layer. By using the space between the components of the circuit, either a much stronger product is achieved while the volume remains the same, or the volume of the apparatus is reduced while the mechanical strength remains the same. If the capping layer provided is sufficiently thick, then the shape of the side of the capping layer facing away from the circuit is substantially independent of the shape of the circuit. This results in a higher degree of modularity, a greater freedom of design and simpler design and development processes. Moreover, a higher degree of integration can be achieved. For example, the capping layer can also be used for constructional or decorative purposes. In a very advantageous application, the capping layer also serves as the housing of a device which comprises the circuit or, in another very advantageous application, the housing serves as the mould.

In addition to reactive injection moulding, other methods of applying a capping layer, without causing damage to the circuit, can be used, such as casting of a casting resin, to obtain the specific advantages associated with the utilization of a circuit having a capping layer in a portable apparatus.

A portable apparatus in which use can be very suitably made of a printed circuit provided with a capping layer formed by means of the method in accordance with the invention, is a mobile telephone.

The invention therefore also relates to a mobile telephone comprising a housing in which a printed circuit is arranged, characterized in that the printed circuit is provided with a synthetic resin capping layer which constitutes the housing of the mobile telephone.

These and other aspects of the invention will be apparent from and elucidated with reference to the embodiments described hereinafter.

DESCRIPTION OF THE PREFERRED EMBODIMENTS

EXAMPLE 1

Figure 1:
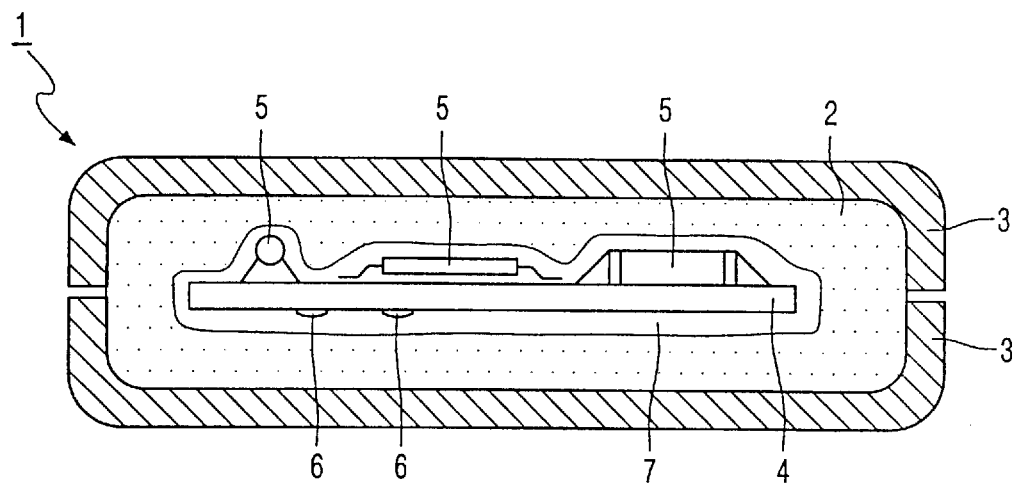
FIG. 1 shows a cross-sectional view of a mobile telephone with a circuit provided with a synthetic resin capping layer in accordance with the invention, and FIG. 2 show, schematically, a cross-sectional view of an embodiment of a mobile phone in accordance with the invention.

FIG. 1 is a schematic, cross-sectional view, not to scale, of a mobile telephone 1 in which a circuit is encapsulated in a synthetic resin capping layer 2, and the assembly is accommodated in a housing 3 which is composed of two shell parts. Said circuit comprises a printed circuit board 4 which is provided with electric and electronic components 5 and soldered joints 6. A buffer layer 7 is provided between the printed circuit and the capping layer 2 so as to be contiguous therewith. The capping layer 2 is composed of a layer exhibiting a variation in mechanical properties, that is, a polyurethane layer which, in the direction from the side of the capping layer facing the circuit to the side of the capping layer facing away from the circuit changes from a soft, elastically compressible foam to a hard and stiff solid material.

The buffer layer 7 and the capping layer 2 can be manufactured by means of the following method. A printed circuit which is suitable for use in a mobile telephone and which comprises a printed circuit board 4 which is customarily provided with components 5 and soldered joints 6, is arranged on a holder and the regions of the circuit which must remain free, such as the electric connections, are covered with adhesive tape. Subsequently, a spraying gun is used to provide the surface of the circuit so many times with a solution of a sprayable two-component polyurethane system, which system is available under the trade name Tivoflex (supplier Tivoli Werke AG, Germany), that, after evaporation and curing, a buffer layer 7 having a thickness in the range between 0.2 and 0.4 mm is obtained. Subsequently, the adhesive tape is removed. If the distance between the spraying gun and the circuit is approximately 30 cm, a buffer layer 7 having a desired porous structure is obtained.

Subsequently, the circuit is accommodated in an injection mould composed of two halves. In the closed state, the mould defines a cavity the shape of which corresponds to the outside of the capping layer 2 to be formed. In fact, this shape is independent of the shape of the circuit, with the regions which should not be covered by the capping layer, such as the electric connections, of course being masked by the mould. After the injection mould has been closed, a foam-forming reactive injection-moulding material is injected into a gate in the mould by displacing a plunger, the temperature of the mould being 60° C. The starting materials of the foam-forming reactive injection-moulding material, i.e. methylene diphenyl diisocyanate (tradename Desmodur 44V10B, supplier Bayer AG) and polyoxyethylene diol (tradename Baydur VPPU 1681, Bayer AG) are each circulated at 30° C. between the storage vessel and the mixing head, and just before they are injected, they are mixed under pressure in the mixing head. The presence of moisture in the mould causes the formation of carbon dioxide by a reaction with the injection-moulding material, so that foam formation takes place during reactive injection moulding. After 1 minute, the foam-forming reactive injection-moulding material has cured and the capping layer 2 has been formed, whereafter the mould is opened and the printed circuit covered with the capping layer 2 is removed. The capping layer 2 has an average density of 600 kg/m$^3$, but it exhibits, in directions at right angles to the capping layer, a continuous, gradual variation of the mechanical properties. The side of the capping layer 2 facing the circuit exhibits a strong degree of foaming and hence is relatively soft and elastically compressible. In the direction from the side of the capping layer facing the circuit to the side of the capping layer facing away from the circuit, the stiffness and hardness of the capping layer increases. The side of the capping layer facing way from the circuit is at least substantially solid and has a density of 1100 kgm$^3$.

The mobile telephone 1 is completed by providing injection-moulded preformed parts, which form the housing 3.

EXAMPLE 2

Example 1 is repeated, with this difference that the buffer layer 7 is manufactured as follows: the circuit is arranged on a table having a perforated worktop through which air can be exhausted. The worktop forms the upper side of a chamber in which an underpressure can be generated by means of a vacuum pump. Subsequently, the circuit is covered with a soft, elastic, adhesive foil (3M Scotch VHB System, supplier 3M) having a thickness of approximately 0.1 mm. Said foil is covered with an air-tight cloth whose size is sufficient to cover the perforations in the worktop. Subsequently, an underpressure is generated in the space between the foil and the circuit by means of the vacuum pump, so that the foil is stretched tight against the circuit and adheres thereto owing to the fact that the foil used is an adhesive foil. The other side of the circuit is provided with a foil in a corresponding manner. Excess foil material projecting beyond the edges is removed. As is customary with such type of foils, the contours of the product, in this case the circuit, covered with the foil are roughly followed. As a result, for example, slits between the components 5 and the printed circuit board 4 are sealed.

EXAMPLE 3

Example 2 is repeated, with this difference that for the foil use is made of a polyethylene foam foil having a compressive modulus below 1 MPa, which is provided on one side with an adhesive layer and which is available from the firm of Stokvis.

EXAMPLE 4

Example 1 is repeated, with this difference that the buffer layer 7 is omitted.

EXAMPLE 5

The circuits provided with a capping layer in accordance with examples 1 to 4 are tested. It was found that none of the circuits was damaged by the reactive injection-moulding process.

In order to test the reliability of the circuit during operation, the circuits of examples 1 to 4 are subjected to a life test in which they are exposed to temperatures varying from −20° C. to +85° C. in a 90 minute cycle. After at least 380 of such cycles, it was found that all circuits were still operative. Calculations predict that the highest degree of reliability is obtained by using a buffer layer.

EXAMPLE 6

Example 2 is repeated, with this difference that a buffer layer is provided which is covered, on the side facing way from the circuit, with an aluminium layer which provides a shield against electromagnetic radiation. In this case, a polyester foil (Mylar) provided with a ten micrometer thick aluminium layer (supplier Stanniolfabrik Eppstein, Eppstein, Germany) is covered, on the polyester side, with a soft, elastic bilaterally adhesive foil (3M Scotch VHB System, supplier 3M). The laminate thus formed is subsequently cut into such a shape that the portions of the circuit where the aluminium layer must electrically contact the earth-points of the circuit in order to achieve an earthed electromagnetic shielding layer will remain free. Subsequently, the patterned laminate is provided on the circuit in the manner described in example 2, and the aluminium layer is earthed by electrically contacting it, at the location of the above-mentioned uncovered portions, to earth-points of the circuit by the provision of "Leitsilber".

If, as in example 1, the circuit is already covered with a Tivoflex buffer layer before the laminate is provided, also said Tivoflex buffer layer must be provided with a pattern, which can be achieved in a simple manner by using a soot-filled Tivoflex buffer layer which is locally removed by ablation using laser light.

EXAMPLE 7

Figure 2:
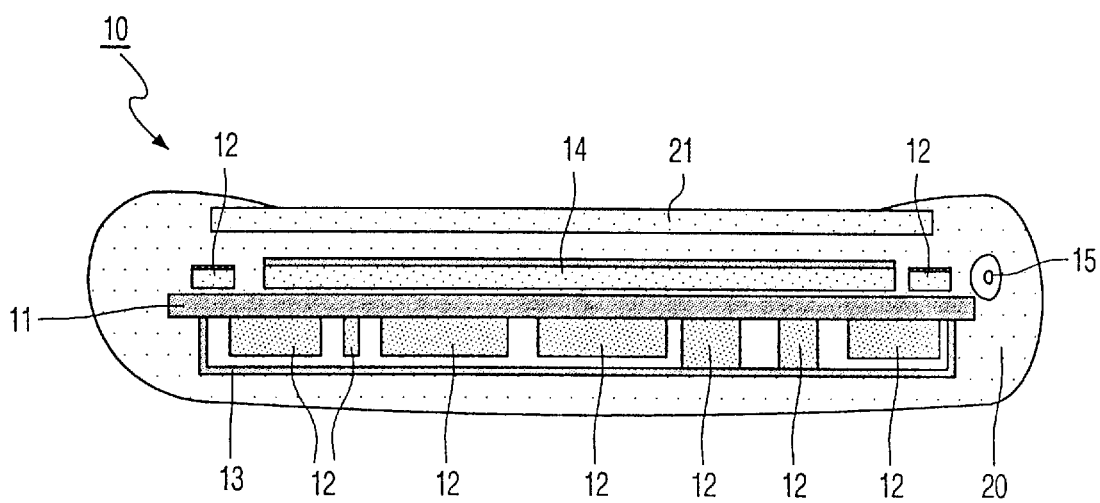

FIG. 2 shows, schematically, a cross-sectional view of an embodiment of a mobile phone 10 in accordance with the invention. The interior parts of the mobile phone 10 are of a conventional design and include a printed circuit comprising a printed circuit board 11 which is provided on both sides with electr(on)ic components 12 and 13. The electronic components 13 are electric shielding components which shield the components 12 from electromagnetic radiation in particular in the radio-frequency range used by the mobile phone itself to send and/or receive. Other interior parts of the mobile phone 10 include a liquid crystal display 14 and an antenna 15. The printed circuit of the mobile phone 10 is provided with a synthetic resin capping layer 20. The capping layer 20 also serves as the housing of the mobile phone 10. A transparent front window 21 covers the display 14.

The capping layer 20 is contiguous to and integrally encapsulates the interior parts of the mobile phone 10 and exhibits a variation in mechanical properties in a direction at right angles to said capping layer 20 thus providing mechanical support across a substantial part of the combined surface area of the interior parts in a delocalized and homogeneous manner. As a result the interior parts of the mobile phone 10 are properly protected against mechanical stresses. In particular, this is the case if the mobile phone 10 is subjected to a drop test wherein the mobile phone 10 is dropped on a concrete floor from a height of 165 cm. Compared to mobile phones having a conventional housing of two synthetic resinous shells joined by means of screws or other suitable means for joining synthetic resinous parts, the highest mechanical stress levels experienced during the drop test are far lower because the total mechanical stress is more evenly spread out across the housing of the mobile phone. In this manner, the likelihood of failure of the mobile phone due to mechanical stress is reduced.

The interspace which is normally present between the interior parts and a conventional housing is in the case of the mobile phone in accordance with the invention occupied by the capping layer. As a result, a more robust mobile phone is obtained and the housing may be manufactured using softer materials.

The synthetic resin capping layer 20 may be manufactured using the method described in Example 1 with this difference that the injection mould in the present example defines the exterior surface of the housing of the mobile phone. Again, injection moulding is performed in such a manner that the capping layer is not applied onto parts of the surface of the interior parts where this is undesired such as on the display 14.

What is claimed is:

1. A printed circuit which is provided with a synthetic resin capping layer, said circuit comprising a printed circuit board having at least one electric component, and the capping layer comprising a foam-forming reactive injection-moulding material exhibiting a variation of mechanical properties in a direction at right angles to a surface of the capping layer, characterized in that said variation of the mechanical properties comprises a continuous increase in hardness of the capping layer.

2. A portable apparatus which is provided with a printed circuit as claimed in claim 1.

3. A mobile phone comprising a printed circuit as claimed in claim 1.

4. A mobile phone as claimed in claim 3 wherein the capping layer of the printed circuit constitutes the housing of the mobile telephone.

5. A mobile telephone comprising a housing in which a printed circuit is arranged, characterized in that the printed circuit is provided with a synthetic resin capping layer having a continuously varying hardness and comprising a foam-forming reactive injection-moulding material which constitutes the housing of the mobile telephone.

* * * * *